(12) United States Patent
Liu et al.

(10) Patent No.: US 10,520,820 B2
(45) Date of Patent: Dec. 31, 2019

(54) NEGATIVE TONE DEVELOPER FOR EXTREME ULTRAVIOLET LITHOGRAPHY

(71) Applicant: Taiwan Semiconductor Manufacturing Co., Ltd., Hsinchu (TW)

(72) Inventors: Chen-Yu Liu, Kaohsiung (TW); Wei-Han Lai, New Taipei (TW); Tzu-Yang Lin, Tainan (TW); Ming-Hui Weng, New Taipei (TW); Ching-Yu Chang, Yilang County (TW); Chin-Hsiang Lin, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 155 days.

(21) Appl. No.: 15/694,222

(22) Filed: Sep. 1, 2017

(65) Prior Publication Data

US 2018/0341177 A1 Nov. 29, 2018

Related U.S. Application Data

(60) Provisional application No. 62/511,758, filed on May 26, 2017.

(51) Int. Cl.
*G03F 7/32* (2006.01)
*G03F 7/16* (2006.01)
*G03F 7/20* (2006.01)

(52) U.S. Cl.
CPC ............... *G03F 7/325* (2013.01); *G03F 7/16* (2013.01); *G03F 7/20* (2013.01); *G03F 7/2004* (2013.01)

(58) Field of Classification Search
CPC . G03F 7/16; G03F 7/20; G03F 7/2004; G03F 7/038; G03F 7/325
USPC .................. 430/296, 325, 330, 331, 942
See application file for complete search history.

(56) References Cited

U.S. PATENT DOCUMENTS

| | | |
|---|---|---|
| 8,796,666 B1 | 8/2014 | Huang et al. |
| 8,900,802 B2 | 12/2014 | Allen et al. |
| 9,012,132 B2 | 4/2015 | Chang |
| 9,028,915 B2 | 5/2015 | Chang et al. |
| 9,093,530 B2 | 7/2015 | Huang et al. |
| 9,146,469 B2 | 9/2015 | Liu et al. |
| 9,213,234 B2 | 12/2015 | Chang |
| 9,223,220 B2 | 12/2015 | Chang |
| 9,256,133 B2 | 2/2016 | Chang |
| 9,459,536 B1 | 10/2016 | Lai et al. |
| 9,536,759 B2 | 1/2017 | Yang et al. |
| 9,548,303 B2 | 1/2017 | Lee et al. |

OTHER PUBLICATIONS

John J Biafore et al., "Statistical Simulation of Resist at EUV and ArF," Proceedings of SPIE—The International Society for Optical Engineering—Mar. 2009, vol. 7273 (11 pages).

*Primary Examiner* — Christopher G Young
(74) *Attorney, Agent, or Firm* — Haynes and Boone, LLP (57) ABSTRACT

The present disclosure provides NTD developers and corresponding lithography techniques that can overcome resolution, line edge roughness (LER), and sensitivity (RLS) tradeoff barriers particular to extreme ultraviolet (EUV) technologies, thereby achieving high patterning fidelity for advanced technology nodes. An exemplary lithography method includes forming a negative tone resist layer over a workpiece; exposing the negative tone resist layer to EUV radiation; and removing an unexposed portion of the negative tone resist layer in a negative tone developer, thereby forming a patterned negative tone resist layer. The negative tone developer includes an organic solvent having a log P value greater than 1.82. The organic solvent is an ester acetate derivative represented by $R_1COOR_2$. $R_1$ and $R_2$ are hydrocarbon chains having four or less carbon atoms. In some implementations, $R_1$, $R_2$, or both $R_1$ and $R_2$ are propyl functional groups, such as n-propyl, isopropyl, or 2-methylpropyl.

20 Claims, 5 Drawing Sheets

NEGATIVE TONE DEVELOPER FOR EXTREME ULTRAVIOLET LITHOGRAPHY

This application is a non-provisional application of and claims benefit of U.S. Provisional Patent Application Ser. No. 62/511,758, filed May 26, 2017, the entire disclosure of which is incorporated herein by reference.

BACKGROUND

Lithography processes are extensively utilized in integrated circuit (IC) manufacturing, where various IC patterns are transferred to a workpiece to form an IC device. A lithography process typically involves forming a resist layer over the workpiece, exposing the resist layer to patterned radiation, and developing the exposed resist layer, thereby forming a patterned resist layer. The patterned resist layer is used as a masking element during subsequent IC processing, such as an etching process, where a resist pattern of the patterned resist layer is transferred to the workpiece. A quality of the resist pattern directly impacts a quality of the IC device. As IC technologies continually progress towards smaller technology nodes (for example, down to 14 nanometers, 10 nanometers, and below), resolution, roughness (for example, line edge roughness (LER) and/or line width roughness (LWR)), and/or contrast of the resist pattern has become critical. Multiple factors affect resolution, roughness, and/or contrast of the resist pattern, among which is a developer used for developing the exposed resist layer. Positive tone development (PTD) processes, which remove exposed portions of the resist layer, often use aqueous base developers, and negative tone development (NTD) processes, which remove unexposed portions of the resist layer, often use organic-based developers. Currently, though PTD processes provide sufficient resist contrast, PTD processes cause resist swelling issues that degrade LER and/or LWR. In contrast, though NTD processes typically minimize (or even eliminate) resist swelling issues, NTD processes provide insufficient resist contrast, degrading resolution. Accordingly, although existing lithography techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The present disclosure relates generally to methods for manufacturing integrated circuit (IC) devices, and more particularly, to lithography techniques and/or lithography materials implemented during manufacturing of IC devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

A lithography process involves forming a resist layer over a workpiece and exposing the resist layer to patterned radiation. After exposed to the patterned radiation, the resist layer is developed in a developer (in other words, a chemical solution). The developer removes portions of the resist layer (for example, exposed portions of positive tone resist layers or unexposed portions of negative tone resist layers), thereby forming a patterned resist layer. The patterned resist layer is then often used as a masking element during a subsequent process, such as an etching process or an implantation process, to transfer a pattern in the patterned resist layer (referred to herein as a resist pattern) to the workpiece. Advanced lithography materials, such as chemically amplified resist (CAR) materials, have been introduced to improve sensitivity of the resist layer to the radiation, thereby maximizing utilization of the radiation. Sensitivity (S) generally corresponds with an amount of incident radiation (amount of energy per unit area) required to produce sufficient chemical reactions to define a pattern in a resist layer. For example, CAR materials can generate multiple chemical reactions upon exposure to radiation, thereby chemically amplifying a response to the radiation, which reduces sensitivity (in other words, lower exposure doses are required for defining the pattern in the resist layer). CAR materials typically include a polymer that is resistant to an IC process (such as an etching process), an acid generating component (such as a photoacid generator (PAG)), and a solvent component. The PAG generates acid upon exposure to radiation, which functions as a catalyst for causing chemical reactions that decrease (or increase) solubility of exposed portions of a resist layer. For example, in some implementations, acid generated from the PAG catalyzes crosslinking of the polymer, thereby reducing solubility of the exposed portions.

While CAR materials are configured to minimize sensitivity, CAR materials must also satisfy other resist performance characteristics, in particular, resolution (R) and line edge roughness (LER). Resolution generally describes an ability of a resist material to print (image) a minimum feature size with acceptable quality and/or control, where resist contrast, resist thickness loss, proximity effects, swelling and/or contraction of the resist material (typically caused by development), and/or other resist characteristics and/or lithography characteristics contribute to the resolution. Resist contrast generally refers to an ability of a resist material to distinguish between light (exposed) regions and dark (unexposed) regions, where resist materials with higher contrasts provide better resolution, resist profiles, and/or LER. Roughness, such as LER and/or line width roughness (LWR), generally describes whether a pattern in a resist layer includes edge variations, width variations, critical dimension variations, and/or other variations. LER generally describes deviations in edges of a line, whereas LWR generally describes deviations of width of a line (for example, from critical dimension (CDU) width). Improving one resist performance characteristic (for example, reducing LER) often comes at the expense of degrading another resist performance characteristic (for example, increasing sensitivity), such that attempts at simultaneously minimizing resolution, LER, and sensitivity is referred to as RLS tradeoff. Overcoming the RLS tradeoff presents challenges to meeting lithography process demands for advanced technology nodes (for example, 14 nanometers, 10 nanometers, 5 nanometers, and below).

Extreme ultraviolet (EUV) lithography, which utilizes radiation having wavelengths in the EUV range, provides promise for meeting finer lithography resolution limits, particularly for sub-10 nm IC manufacturing. However, higher sensitivity CAR materials are often required at EUV wavelengths because exposure doses required for meeting resolution, contrast, and/or LER requirements, along with throughput requirements (such as wafers per hour (WPH)), are limited by conventional EUV sources. For example, since a number of photons absorbed by a volume of a resist material is proportional to wavelength and an amount of absorbed energy is proportional to exposure dose, a total absorbed energy is discretized into fewer photons as wavelength decreases. It has thus been observed that a volume of resist material absorbs fewer EUV photons than DUV photons (such as ArF photons) when exposed to the same exposure dose (for example, about 10 mJ/cm$^2$), which often means that less acid will be generated by CAR materials for catalyzing reactions. In some cases, the volume of resist material absorbs as much as 14× fewer EUV photons. Such phenomenon is generally referred to as shot noise. Though increasing EUV exposure dose can alleviate the shot noise, thereby improving resolution, contrast, and/or roughness, such is achieved by increasing EUV source power or decreasing scan speed (in other words, decreasing throughput, such as wafers per hour (WPH)). Since current EUV sources are limited to EUV source power of about 80 W and decreasing throughput is not a viable option for meeting next generation IC manufacturing requirements, the developing process is currently being explored for improving sensitivity of CAR resist materials while still meeting other RLS characteristics, such as resolution and LER.

There are generally two types of developing processes: a positive tone development (PTD) process and a negative tone development (NTD) process. The PTD process uses a positive tone developer, which generally refers to a developer that selectively dissolves and removes exposed portions of the resist layer. The NTD process uses a negative tone developer, which generally refers to a developer that selectively dissolves and removes unexposed portions of the resist layer. PTD developers are typically aqueous base developers, such as tetraalkylammonium hydroxide (TMAH), and NTD developers are typically organic-based developers, such as n-butyl acetate (n-BA). Both PTD processes and NTD processes have drawbacks when attempting to meet lithography resolution demands for advanced technology nodes. For example, both PTD processes and NTD processes (particularly those using NTD developers that include n-BA solvents) have been observed to cause resist pattern swelling, leading to insufficient contrast between exposed portions and unexposed portions of the resist layer (in other words, poor resist contrast) and resulting in higher than desired LER/LWR and/or low patterning fidelity. However, because NTD processes typically provide better normalized image log-slope (NILS) than PTD processes, NTD processes have become the focus for improving resolution for advanced technology nodes. The present disclosure thus explores NTD developers and corresponding lithography techniques that can improve sensitivity of CAR materials (specifically, reducing an amount of exposure dosage required) to EUV radiation without degrading resolution and roughness, thereby overcoming the RLS tradeoff and achieving high patterning fidelity for advanced technology nodes.

Figure 1:
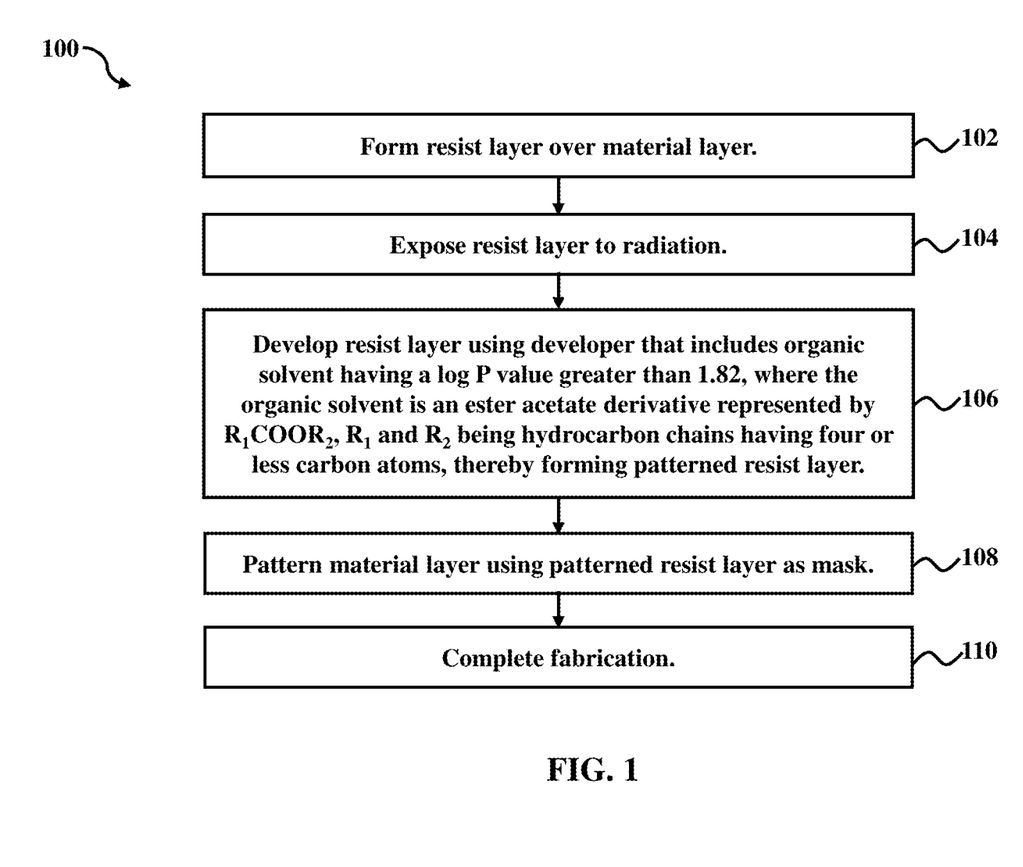
FIG. 1 is a flow chart of a lithography method for processing a workpiece according to various aspects of the present disclosure.

FIG. 1 is a flow chart of a lithography method 100 for processing a workpiece (for example, a substrate) according to various aspects of the present disclosure. In some implementations, method 100 is implemented, in whole or in part, by a system employing advanced lithography processes, such as DUV lithography, EUV lithography, e-beam lithography, x-ray lithography, and/or other lithography to enhance lithography resolution. At block 102, a resist layer is formed over a material layer of a workpiece. In some implementations, the resist layer is a negative tone resist layer, and the material layer is a portion of a wafer (or substrate). At block 104, the resist layer is exposed to radiation, for example, patterned radiation. In some implementations, the resist layer is exposed to patterned EUV radiation. In some implementations, after exposure, the resist layer is baked, for example, by a post exposure baking process. At block 106, the resist layer is developed using a developer having an organic solvent having a log P value greater than 1.82, thereby forming a patterned resist layer. The organic solvent is an ester acetate derivative represented by $R_1COOR_2$, where $R_1$ and $R_2$ are hydrocarbon chains having four or less carbon atoms. In some implementations, $R_1$, $R_2$, or both $R_1$ and $R_2$ are propyl functional groups. In some implementations, $R_1$ is n-propyl and $R_2$ is isopropyl. In some implementations, $R_1$ is isopropyl and $R_2$ is n-propyl. In some implementations, $R_1$ is ethyl and $R_2$ is 2-methylpropyl. The developer removes unexposed portions of the resist layer. At block 108, a fabrication process is performed to the workpiece using the patterned resist layer as a mask. For example, the material layer is patterned using the patterned resist layer as a mask. In some implementations, the material layer is etched, such that the material layer includes a pattern corresponding with a pattern of the patterned resist layer. In some implementations, doped regions are formed in the material layer, such that the material layer includes doped regions a pattern corresponding with a pattern of the patterned resist layer. At block 110, method 100 can proceed with completing fabrication of the workpiece. Additional steps can be provided before, during, and after method 100, and some of the steps described can be moved, replaced, or eliminated for additional embodiments of method 100.

FIGS. 2A-2E are fragmentary cross-sectional views of a workpiece 200, in portion or entirety, at various fabrication stages (such as those associated with lithography method 100) according to various aspects of the present disclosure. Workpiece 200 is depicted at an intermediate stage of fabrication (or processing) of an IC device, such as a microprocessor, a memory, and/or other IC device. In some implementations, workpiece 200 may be a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, fin-like field effect transistors (FinFETs), other suitable IC components, or combinations thereof. FIGS. 2A-2E have been simplified for the sake of clarity to better understand the inventive concepts of the present disclosure. Additional features can be added in workpiece 200, and some of the features described below can be replaced, modified, or eliminated in other embodiments of workpiece 200.

Figure 2A:
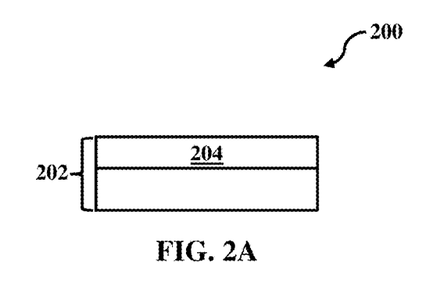
FIGS. 2A-2E are fragmentary cross-sectional views of a workpiece, in portion or entirety, at various fabrication stages (such as those associated with the lithography method of FIG. 1) according to various aspects of the present disclosure.

In FIG. 2A, workpiece 200 includes a wafer 202, which includes a substrate (for example, a semiconductor substrate), a mask (also referred to as a photomask or reticle), or any base material on which processing may be conducted to provide layers of material to form various features of an IC device. Depending on IC fabrication stage, wafer 202 includes various material layers (for example, dielectric layers, semiconductor layers, and/or conductive layers) configured to form IC features (for example, doped regions/features, isolation features, gate features, source/drain features (including epitaxial source/drain features), interconnect features, other features, or combinations thereof). In the depicted embodiment, wafer 202 includes a semiconductor substrate, such as a silicon substrate. Alternatively or additionally, wafer 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or combinations thereof. Alternatively, wafer 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. In some implementations, where workpiece 200 is fabricated into a mask for patterning IC devices, wafer 202 can be a mask substrate that includes a transparent material (for example, calcium fluoride ($CaF_2$)) or a low thermal expansion material (for example, fused quartz, $TiO_2$ doped $SiO_2$, or other suitable low thermal expansion materials).

A material layer 204 to be processed (also referred to herein as an underlying layer) is disposed over wafer 202. However, the present disclosure contemplates implementations where material layer 204 is omitted, such that wafer 202 is directly processed. In some implementations, material layer 204 includes a conductive material or a semiconductor material, such as metal or metal alloy. In some implementations, the metal includes titanium (Ti), aluminum (Al), tungsten (W), tantalum (Ta), copper (Cu), cobalt (Co), ruthenium (Ru), other suitable metal, or combinations thereof. In some implementations, the metal alloy includes metal nitride, metal sulfide, metal selenide, metal oxide, metal silicide, other suitable metal alloy, or combinations thereof. In such implementations, the metal alloy can be represented by a formula $MX_a$, where M is a metal and X is selected from the group consisting of nitrogen (N), sulfur (S), selenide (Se), oxygen (O), and silicon (Si). In some implementations, a is about 0.4 to about 2.5. For example, in some implementations, material layer 204 includes titanium nitride (TiN), tungsten nitride ($WN_2$), or tantalum nitride (TaN). Alternatively, in some implementations, material layer 204 includes a dielectric material, such as silicon oxide ($SiO_2$), silicon nitride (SiN), metal oxide, or metal nitride. In such implementations, a material of material layer 204 can be represented by a formula $MX_b$, where M is a metal (for example, Al, hafnium (Hf), or lanthanum (La)) or Si and X is N, O, and/or carbon (C). In some implementations, b is about 0.4 to about 2.5. For example, in some implementations, material layer 204 includes $SiO_2$, SiN, silicon oxynitride (SiON), silicon carbon nitride (SiCN), silicon carbide (SiC), aluminum oxide ($Al_2O_3$), hafnium oxide ($HfO_2$), or lanthanum oxide ($La_2O_3$). In some implementations, the dielectric material has a dielectric constant (k) of about 1 to about 40, such that the dielectric material can be a low-k dielectric material or a high-k dielectric material depending on IC design requirements. In some implementations, material layer 204 is a hard mask layer to be patterned for use in subsequent processing of workpiece 200. In some implementations, material layer 204 is an anti-reflective coating (ARC) layer. In some implementations, material layer 204 is a layer to be used for forming a gate feature (for example, a gate dielectric and/or a gate electrode), a source/drain feature (for example, an epitaxial source/drain), and/or a contact feature (for example, a conductive or dielectric feature of a multilayer interconnect (MLI)) of workpiece 200. In some implementations, where workpiece 200 is fabricated into a mask for patterning IC devices, material layer 204 is a layer to be processed to form an IC pattern therein, such as an absorber layer (including, for example, chromium) or a reflective layer (including, for example, multiple layers formed on wafer 202, where the multiple layers include a plurality of film pairs, such as molybdenum-silicide (Mo/Si) film pairs, molybdenum-beryllium (Mo/Be) film pairs, or other suitable material film pairs configured for reflecting radiation).

Figure 2B:
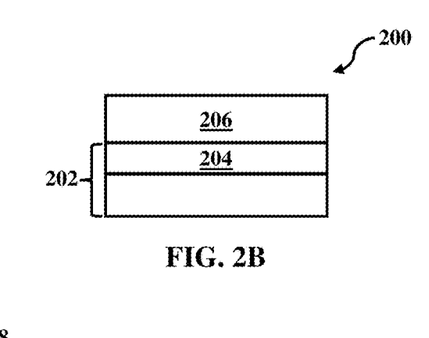

In FIG. 2B, a resist layer 206 is formed over wafer 202 by any suitable process. Resist layer 206 is also referred to as a photoresist layer, photosensitive layer, imaging layer, patterning layer, or radiation sensitive layer. Resist layer 206 is sensitive to radiation used during a lithography exposure process, such as DUV radiation, EUV radiation, e-beam radiation, ion beam radiation, and/or other suitable radiation. In the depicted embodiment, resist layer 206 includes a material sensitive to EUV radiation. In some implementations, resist layer 206 is formed by spin coating a liquid resist material onto a material layer to be processed, such as material layer 204. After spin coating the liquid resist material (but before performing an exposure process), a pre-bake process can be performed on resist layer 206, for example, to evaporate solvent and to densify the liquid resist material formed over material layer 204. In some implementations, before forming resist layer 206, an ARC layer is formed over material layer 204, such that resist layer 206 is formed over the ARC layer. The ARC layer may be a nitrogen-free ARC (NFARC) layer that includes a material such as $SiO_2$, silicon oxygen carbide (SOC), plasma enhanced chemical vapor deposited silicon oxide (PECVD-$SiO_2$), other suitable material, or combinations thereof. In some implementations, more than one layer (including one or more ARC layers) can be formed between material layer 204 and resist layer 206.

Resist layer 206 includes a chemically amplified resist (CAR) material. For purposes of the following discussion, resist layer 206 includes a negative tone material (and is thus also referred to as a negative tone resist layer), where portions of resist layer 206 exposed to radiation become insoluble (or exhibit reduced solubility) to a developer and unexposed portions of resist layer 206 remain soluble to the developer. Alternatively, the present disclosure contemplates implementations where resist layer 206 includes a positive tone resist material (and is thus referred to as a positive tone resist layer), where portions of resist layer 206 exposed to radiation become soluble to a developer and unexposed portions of resist layer 206 remain insoluble to the developer. In some implementations, the CAR material includes a polymer and/or other suitable resist components mixed in a solvent, which are configured to provide the negative tone material (in the depicted embodiment) or the positive tone material (in alternate embodiments). The other resist components can include a photo acid generator (PAG) component, a thermal acid generator (TAG) component, an acid labile group (ALG) component, a quencher component, a photo-decomposable base (PDB) component, a chromophore component, a cross-linker component, a surfactant component, and/or other suitable component depending on requirements of the CAR material. In some implementations, the CAR resist material includes the PAG component, which generates acid upon absorbing radiation. In the depicted embodiment, where resist layer 206 is a negative tone resist layer, acid generated from the PAG component catalyzes cross-linking of polymer in the CAR resist material and/or suppressing reactions of other resist components (such as ALG components) with polymer in the CAR resist material, changing characteristics (for example, polarity and/or solubility) of exposed portions of resist layer 206. For example, when resist layer 206 is exposed with radiation reaching a defined exposure dose threshold, exposed portions of resist layer 206 exhibit decreased solubility in (and/or increased hydrophobicity to) a developer. In some implementations, the CAR resist material includes poly (hydroxystyrene) (PHS), methacrylate, or a PHS/methacrylate hybrid. In some implementations, where the CAR resist material is a PHS resist material, the PHS resist material includes less than about 40% PHS, but greater than 0%. The PHS resist material can include PHS polymer, which may be a part of a copolymer in the PHS resist material or blended with another polymer to form a PHS resist layer. In some implementations, the CAR resist material, such as the PHS resist material includes one or more hydroxybenzyl groups.

Figure 2C:
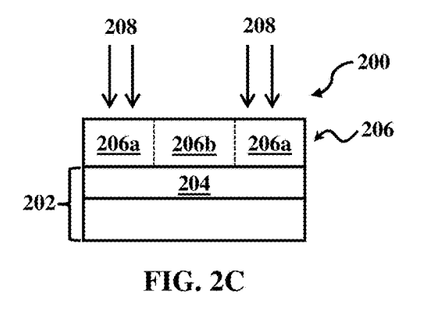

In FIG. 2C, an exposure process is performed on resist layer 206, where resist layer 206 is illuminated with patterned radiation. In some implementations, resist layer 206 is exposed to patterned radiation having a wavelength less than about 250 nm, such as DUV radiation (for example, 248 nm radiation from a KrF laser or 193 nm radiation from an ArF laser), EUV radiation, x-ray radiation, e-beam radiation, ion-beam radiation, and/or other suitable radiation. In the depicted embodiment, resist layer 206 is exposed to EUV radiation, which generally refers to radiation having a wavelength of about 1 nm to about 100 nm. In some implementations, the EUV radiation has a wavelength of about 10 nm to about 15 nm (for example, about 13.5 nm). The exposure process can be in air, liquid (immersion lithography), or vacuum (for example, when implementing EUV lithography and/or e-beam lithography). In some implementations, the radiation is patterned using a mask having an IC pattern defined therein, such that the patterned radiation forms an image of the IC pattern on resist layer 206. The mask transmits, absorbs, and/or reflects the radiation depending on the IC pattern, along with mask technologies used to fabricate the mask. Various resolution enhancement techniques, such as phase-shifting, off-axis illumination (OAI), and/or optical proximity correction (OPC), may be implemented through the mask or the exposing process. For example, OPC features may be incorporated into the IC pattern. In another example, the mask is a phase-shift mask, such as an alternative phase-shift mask, an attenuated phase-shift mask, or a chromeless phase-shift mask. In yet another example, the exposing process is implemented in an OAI mode. In some implementations, the radiation beam is patterned by directly modulating the radiation beam according to an IC pattern without using a mask (often referred to as maskless lithography).

A latent pattern is formed on resist layer 206 by the exposure process. The latent pattern generally refers to a pattern exposed on the resist layer, which eventually becomes a physical resist pattern when the resist layer is subjected to a developing process. The latent pattern includes exposed portions 206a and unexposed portions 206b (which, in some implementations, includes both unexposed portions and under-exposed portions of resist layer 206). In the depicted embodiment, exposed portions 206a physically and/or chemically change in response to the exposure process. For example, PAG components in exposed portions 206a of resist layer 206 generate acid upon absorbing radiation, which functions as a catalyst for causing chemical reactions that decrease (or increase) solubility of exposed portions 206a. For example, acid generated from the PAG components catalyzes cross-linking of polymer and/or suppressing reactions of other resist components (such as ALG components) with polymer in exposed portions 206a of resist layer 206, thereby chemically changing exposed portions 206a. In some implementations, after the exposure process, a post-exposure baking (PEB) process is performed on resist layer 206, which can effect the cross-linking of polymer and/or suppression of reactions of other resist components with the polymer. In the depicted embodiment, the exposure process and/or the PEB process decrease hydrophilicity of exposed portions 206a (in other words, the polymers become more hydrophobic), decreasing solubility of exposed portions 206a to a developer. Alternatively, in some implementations, the exposure process and/or the PEB process increase hydrophilicity of exposed portions 206a (in other words, the polymers become more hydrophilic), increasing solubility of exposed portions 206a to the developer.

Figure 2D:
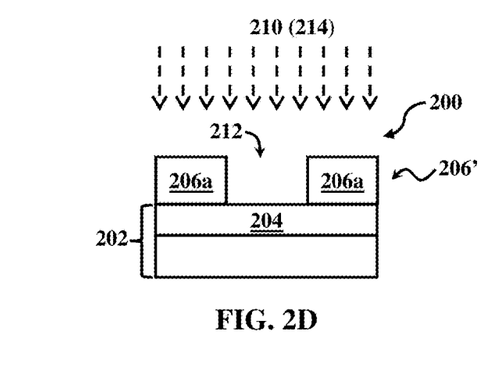

In FIG. 2D, a developing process is performed on resist layer 206, thereby forming patterned resist layer 206'. In the depicted embodiment, a negative tone development (NTD) process is performed to remove unexposed portions 206b of resist layer 206. For example, an NTD developer 210 is applied to resist layer 206 that dissolves unexposed portions 206b, leaving patterned resist layer 206' having opening(s) 212 defined therein between exposed portions 206a (collectively referred to as a resist pattern). In some implementations, a rinsing process is performed after the developing process, for example, to remove any residue and/or particles from workpiece 200. In some implementations, a post-development baking (PDB) process is performed, for example, to ensure structural stability of patterned resist layer 206'.

NTD developer 210 includes a new and improved composition that overcomes RLS tradeoff barriers discussed herein, particularly those associated with EUV lithography, providing improved patterning fidelity. NTD developer 210 includes an organic solvent 214 that is an ester acetate derivative having a log P value greater than 1.82. For example, organic solvent 214 is represented by $R_1COOR_2$, where $R_1$ and $R_2$ are hydrocarbon chains having four or less carbon atoms. In some implementations, organic solvent 214 is represented by formula (I):

(I)

where $R_1$, $R_2$, or both $R_1$ and $R_2$ are propyl functional groups. In some implementations, $R_1$ is ethyl and $R_2$ is 2-methylpropyl (also referred to as isobutyl), such that organic solvent 214 is represented by the formula (II):

(II)

In some implementations, $R_1$ is isopropyl and $R_2$ is n-propyl, such that organic solvent 214 is represented by formula (III):

(III)

In some implementations, $R_1$ is n-propyl and $R_2$ is isopropyl, such that organic solvent 214 is represented by formula (IV):

(IV)

In some implementations, $R_1$ and $R_2$ are selected to balance hydrophobicity and hydrophilicity of NTD developer 210, such that organic solvent 214 has a log P value greater than 1.82. For example, in some implementations, $R_1$ and $R_2$ are not polar functional groups. In some implementations, NTD developer 210 further includes another organic solvent, such as n-butyl acetate (n-BA), such that NTD developer 210 includes co-solvents. A ratio between organic solvent 214 and n-BA is determined by characteristics of resist layer 206, such as desired solubility, molecular weights of the polymer, PAG, and/or other resist components, molecular weight dispersity, polarity of monomers, monomer sequences, other suitable resist characteristics, or combinations thereof. In some implementations, NTD developer 210 further includes additives, surfactants, and/or other suitable developer components.

Organic solvent 214 increases hydrophobicity of NTD developer 210, such that NTD developer 210 unable to penetrate (or minimally penetrate) exposed portions 206a, yet is hydrophilic enough to effectively penetrate and remove unexposed portions 206b, resulting in minimal (to no) swelling of exposed portions 206a. Opening(s) 212 are thus defined by relatively smooth edges and/or sidewalls of exposed portions 206a, such that the resist pattern of patterned resist layer 206' exhibits minimal LER/LWR and improved resist contrast, significantly enhancing lithography resolution. The improved LER/LWR and resist contrast is achieved at lower exposure dosages, such as those achievable by current EUV technologies. NTD developer 210 having organic solvent 214 thus improves sensitivity of resist layer 206 without sacrificing resolution and/or LER/LWR, thereby breaking the RLS tradeoff. Accordingly, NTD developer 210 is particularly useful for EUV lithography, the target lithography technology for sub-10 nanometer IC fabrication, which typically requires higher sensitivity. Different embodiments disclosed herein offer different advantages and no particular advantage is necessarily required in all embodiments.

Figure 3:
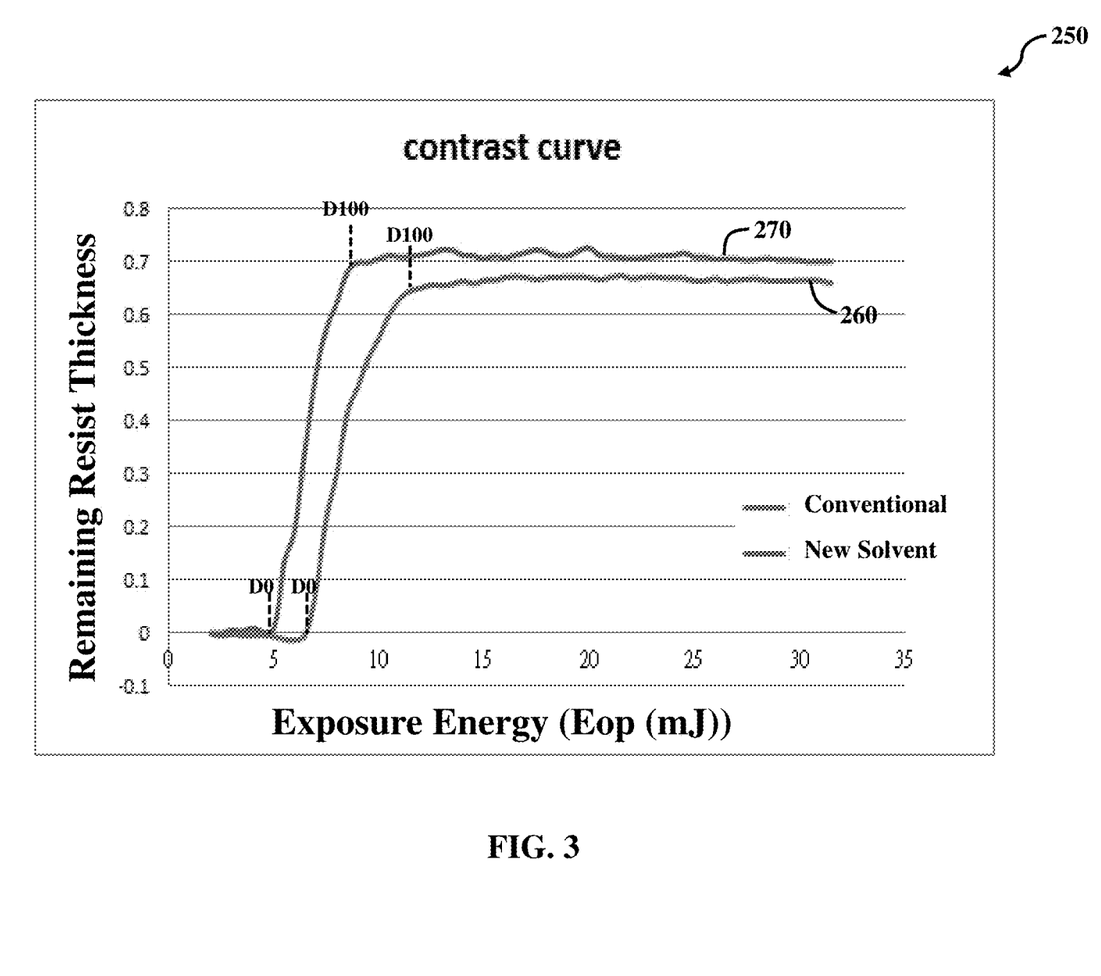
FIG. 3 includes a graph having EUV contrast curves for resist layers developed using different developers according to various aspects of the present disclosure.

NTD developer 210 performs superior to conventional NTD developers including n-BA solvents and/or derivatives thereof, which dissolve resist materials too easily and/or penetrate exposed portions of resist materials (thereby increasing LER and/or pattern deformation). FIG. 3 includes a graph 250 having EUV contrast curves, such as an EUV contrast curve 260 and an EUV contrast curve 270, for resist layers developed using different developers according to various aspects of the present disclosure. EUV contrast curves correlate post-development remaining resist thickness (%) (y-axis) as a function of a logarithm of exposure dose (Eop) (in millijoules (mJ)) (x-axis). EUV contrast curve 260 and EUV contrast curve 270 were obtained by exposing a resist layer, such as resist layer 206, to various exposure doses of EUV radiation and developing the resist layer using different developers. EUV contrast curve 260 corresponds with a resist layer developed by conventional NTD developers, such as n-BA solvents and/or derivatives thereof, having organic solvents with log P values greater than 1.82. EUV contrast curve 270 corresponds with a resist layer developed by NTD developers disclosed herein, such as NTD developer 210 including organic solvent 214 having log P values greater than 1.82. EUV contrast curve 260 and contrast curve 270 each include a slope between D0, a threshold exposure energy dose required for a resist material to become insoluble to a developer, and D100, an exposure energy dosage required for a resist material to become completely insoluble to the developer. As evident from FIG. 3, D0 and D100 for contrast curve 270 are less than D0 and D100 for contrast 260, indicating that insolubility to NTD developer 210 is achieved at a lower exposure doses than insolubility to conventional NTD developers. NTD developer 210 thus reduces sensitivity of resist materials, and in some implementations, has been observed to reduce sensitivity as much as 20%. Such sensitivity improvements were achieved without (or with minimal) degradation in resolution and/or roughness, such as LER, of the resist layer. For example, contrast curve 270 has a greater slope than contrast curve 260, indicating that NTD developer 210 improves resist contrast compared to conventional NTD developers. In some implementations, a slope increase as much as 30% has been observed when using NTD developer 210. Contrast curve 270 also indicates that NTD developer 210 reduces resist loss (for example, by about 5%) to further improve resist contrast, where it has been observed that resist layers exposed to NTD developers 210 experience about 15% to about 35% thickness losses, while resist layers exposed to conventional NTD developers experience greater than about 35% thickness losses. Further, in some implementations, it has been observed that resist layers exposed to NTD developer 210 exhibited less LER, as much as 2% improvement, compared to resist layers exposed to NTD developer 210. NTD developer 210 including organic solvent 214 has thus been observed to break the RLS tradeoff, reducing resolution, LER, and sensitivity, significantly enhancing patterning fidelity.

Figure 2E:
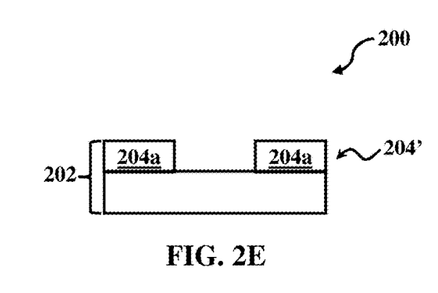

Turning to FIG. 2E, a fabrication process is performed on workpiece 200, such as material layer 204 and/or wafer 202, using patterned resist layer 206' as a mask. For example, the fabrication process is applied only to portions of workpiece 200 within opening(s) 214 of patterned resist layer 206', while other portions of workpiece 200 covered by patterned resist layer 206' are protected from being impacted by the fabrication process. In some implementations, the fabrication process includes performing an etching process on material layer 204 using patterned resist layer 206' as an etching mask. A pattern is thus transferred from patterned resist layer 206' to material layer 204, thereby forming patterned material layer 204'. In implementations where material layer 204 is a hard mask layer (or other type of patterning layer), the pattern is first transferred from patterned resist layer 206' to material layer 204, and then the pattern is transferred from patterned material layer 204' to a material layer of wafer 202. The etching process includes a dry etching process, a wet etching process, other suitable etching process, or combinations thereof. Alternatively, in some implementations, the fabrication process includes performing an implantation process on material layer 204 using patterned resist layer 206' as an implant mask, thereby forming various doped features (regions) in material layer 204. Thereafter, as depicted in FIG. 2E, patterned resist layer 206' is removed from workpiece 200 using any suitable process, such as a resist stripping process, leaving patterned material layer 204' disposed over wafer 202. In some implementations, patterned resist layer 206' may be partially consumed during the fabrication process, such as during the etching process, such that any remaining portion of patterned resist layer 206' is subsequently removed by the resist stripping process. It is noted that the present disclosure also contemplates implementations where instead of patterning material layer 204, a deposition process is performed to fill opening(s) 212 of patterned resist layer 206' with a material, thereby forming IC features over material layer 204 (for example, conductive material lines).

Figure 4:
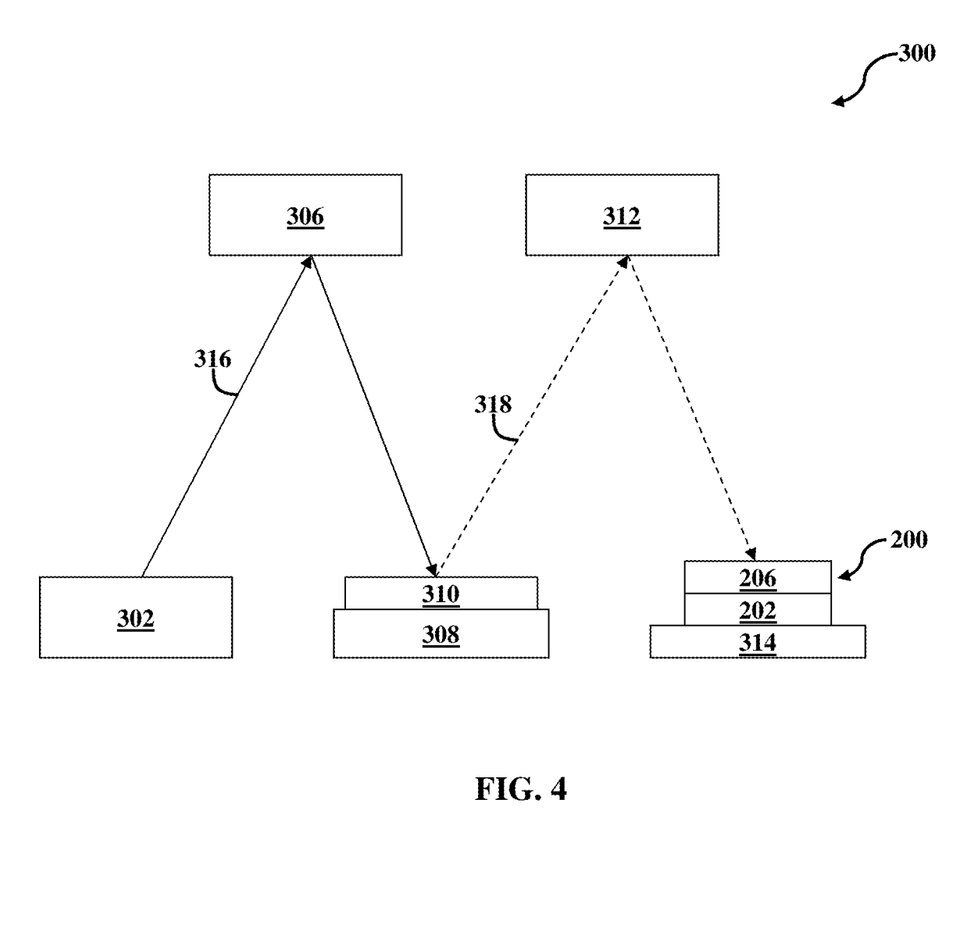
FIG. 4 is a simplified block diagram of a lithography system that can be implemented for exposing processes, such as those associated with the lithography method of FIG. 1, according to various aspects of the present disclosure.

FIG. 4 is a simplified block diagram of a lithography system that can be implemented for exposing processes, such as those associated with the lithography method of FIG. 1, according to various aspects of the present disclosure. Lithography system 250 includes an illumination source 302, illumination optics 306, a mask stage 308 having a mask 310 secured thereon, projection optics 312, and a wafer stage 314 having a workpiece, such as workpiece 200, secured thereon. Illumination source 302 emits radiation 316 having wavelengths in the EUV range, such as from about 1 nm to about 100 nm. In some implementations, illumination source 302 emits EUV radiation having a wavelength of about 13.5 nm. Illumination optics 306 collect, guide, and direct radiation 316 emitted by illumination source 302 to mask 310. Mask stage 308 provides control of a position of mask 310 within lithography system 300 during alignment, focus, leveling, and/or exposure operations. Mask 310 includes an IC pattern, which is used for fabricating one or more IC features and/or devices on workpiece 200. Mask 310 transmits, absorbs, and/or reflects radiation 310 depending on a final mask pattern of mask 310, along with mask technologies used to fabricate mask 310, thereby providing patterned radiation 318. Projection optics 312 collect, guide, and direct patterned radiation 318 to workpiece 200, such that an image of mask 310 is projected onto workpiece 200. In some implementations, projection optics 312 can reduce an image of mask 310 provided by patterned radiation 318 (for example, by implanting optics having a magnification of less than one). Illumination optics 306 and projection optics 312 include refractive optics (such as one or more lenses), reflective optics (such as one or more mirrors), and/or any other illumination/projection components for facilitating illumination optics 306 and projection optics 312 in collecting, guiding, and directing radiation from illumination source 302 to workpiece 200. Workpiece 200 includes wafer 202 having a radiation sensitive layer (in particular, resist layer 206) disposed thereover, where portions of the radiation sensitive layer exposed to the radiation chemically change (for example, become insoluble to a developer, such as NTD developer 210). Wafer stage 314 provides control of a position of workpiece 200 within lithography system 300 during alignment, focus, leveling, and/or exposure operations, such that an image of mask 310 can be scanned or stepped onto workpiece 200 in a repetitive fashion (though other lithography methods are possible). Lithography system 300 can include additional features depending on implemented lithography process technologies. FIG. 4 has been simplified for the sake of clarity to better understand the inventive concepts of the present disclosure. Additional features can be added in lithography system 300, and some of the features described below can be replaced or eliminated for additional embodiments of lithography system 300.

Figure 5:
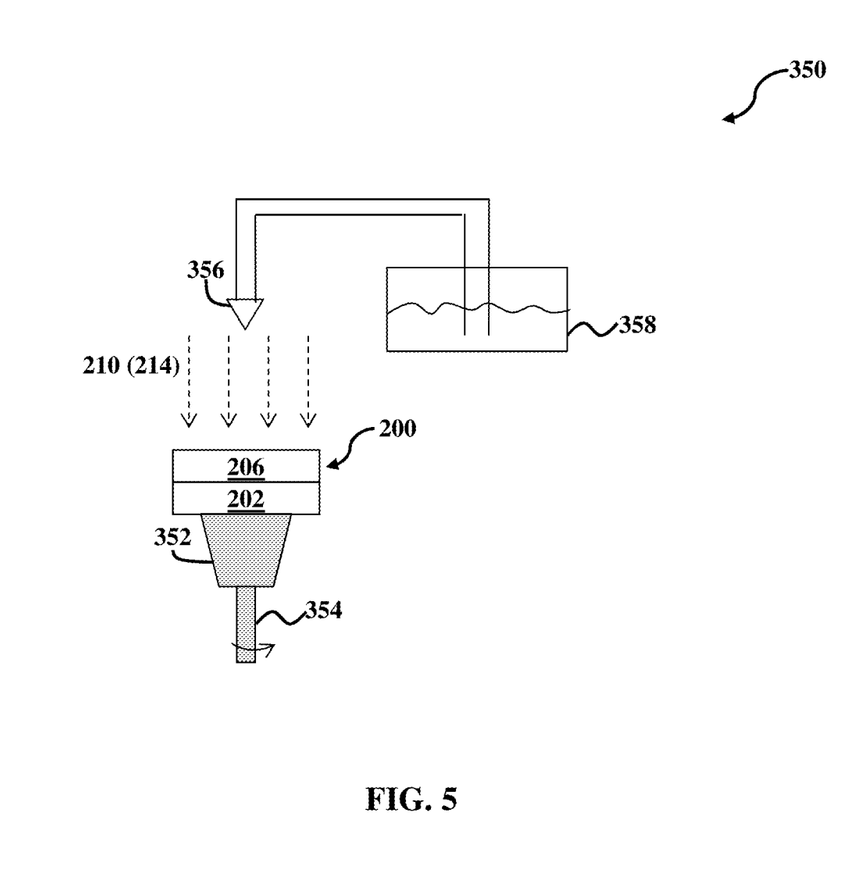
FIG. 5 is a simplified block diagram of a development system that can be implemented for developing processes, such as those associated with the lithography method of FIG. 1, according to various aspects of the present disclosure.

In some implementations, NTD developer 210 is applied to workpiece 200 in a development tool. FIG. 5 is a simplified block diagram of a development system 350 (also referred to as a development tool or a development apparatus) that can be implemented for developing resist layer 206 according to various aspects of the present disclosure. Development system 350 includes a wafer stage 352 having a workpiece, such as workpiece 200, secured thereon, for example, by a vacuum mechanism, e-chucking, or other suitable mechanism. A motion mechanism 354 integrated with wafer stage 352 is operable to drive wafer stage 352, such that wafer stage 352 is operable to spin workpiece 200 during a developing process. In some implementations, motion mechanism 354 includes a motor to drive wafer stage 352 to spin at various speeds depending on processing stage, such as a first speed during a developing process and a second speed during a rinsing process. In some implementations, motion mechanism 354 includes an elevation system configured to move wafer stage 352 along a vertical direction and/or horizontal direction, such that workpiece 200 can be positioned at different levels within development system 350. A nozzle 356 delivers a developer, such as NTD developer 210, to workpiece 200. In some implementations, nozzle 356 dispenses NTD developer 210 while workpiece 200 is spun by wafer stage 352. The developer, such as NTD developer 210, can be stored in a container 358, where NTD developer 210 is delivered to nozzle 356 via a delivery system (for example, having a pump, a pressurized gas, or other mechanism configured to deliver the developer via one or more pipelines to nozzle 356). As described fully above, NTD developer 210 includes organic solvent 214. In some implementations, NTD developer 210 includes n-BA as a co-solvent. In such embodiments, organic solvent 214 and n-BA may be pre-mixed and stored in container 358. Alternatively, organic solvent 214 and n-BA may be stored in separate containers (similar to container 358) and mixed through the delivery system as NTD developer 210 is applied to workpiece 200. In some implementations, developing system 350 can control a mixing ratio between organic solvent 214 and n-BA, which may depend on various physical values related to parameters of resist layer 206. In some implementations, developing tool 350 applies NTD developer 210 in a spin-on process, for example, by spraying NTD developer 210 onto resist layer 206 while spinning workpiece 200. In some implementations, NTD developer 210 is continuously sprayed onto workpiece 200. Alternatively, in some implementations, NTD developer 210 is applied by other means, such as a puddle process. In some implementations, developing system 350 is part of a cluster tool in an IC fabrication process. For example, after resist layer 206 has been exposed in lithography system 300, workpiece 200 is transferred to developing system 350, which applies NTD developer 210 to resist layer 206, thereby forming patterned resist layer 206'. Development system 350 can include additional features depending on implemented lithography process technologies. FIG. 5 has been simplified for the sake of clarity to better understand the inventive concepts of the present disclosure. Additional features can be added in development system 350, and some of the features described below can be replaced or eliminated for additional embodiments of development system 350.

The present disclosure provides various lithography resist materials and corresponding lithography techniques for improving lithography resolution. An exemplary lithography method includes forming a resist layer over a substrate, exposing the resist layer to radiation, and exposing the resist layer to a developer that removes an unexposed portion of the resist layer, thereby forming a patterned resist layer. The developer includes an organic solvent having a log P value greater than 1.82, where the organic solvent is represented by the formula:

At least one of $R_1$ and $R_2$ are a propyl functional group. In some implementations, $R_1$ is n-propyl and $R_2$ is isopropyl. In some implementations, $R_1$ is isopropyl and $R_2$ is n-propyl. In some implementations, $R_1$ is ethyl and $R_2$ is 2-methylpropyl. In some implementations, the resist layer includes a negative tone resist material, where solubility of the negative tone resist material decreases when exposed to the radiation. In some implementations, the radiation is extreme ultraviolet (EUV) radiation or an electron beam (e-beam). In some implementations, the resist layer includes hydroxybenxyl.

Another exemplary lithography method includes forming a negative tone resist layer over a workpiece; exposing the negative tone resist layer to extreme ultraviolet (EUV) radiation; and removing an unexposed portion of the negative tone resist layer in a negative tone developer, thereby forming a patterned negative tone resist layer. The negative tone developer includes an organic solvent having a log P value greater than 1.82, where the organic solvent is an ester acetate derivative represented by $R_1COOR_2$. $R_1$ and $R_2$ are hydrocarbon chains having four or less carbon atoms. In some implementations, $R_1$ is n-propyl and $R_2$ is isopropyl. In some implementations, $R_1$ is isopropyl and $R_2$ is n-propyl. In some implementations, $R_1$ is ethyl and $R_2$ is 2-methylpropyl. In some implementations, the method further includes performing a baking process on the negative tone resist layer after the exposing. In some implementations, the method further includes processing the workpieces using the patterned negative tone resist layer as a mask. In some implementations, the the negative tone resist layer includes less than about 40% poly(p-hydroxystyrene) (PHS). In some implementations, the method further includes the negative tone developer further includes n-butyl acetate (n-BA).

An exemplary lithography developing composition has a log P value greater than 1.82, where the lithography developing composition includes an organic solvent represented by the formula:

At least one of $R_1$ and $R_2$ are a propyl functional group. In some implementations, $R_1$ is n-propyl and $R_2$ is isopropyl. In some implementations, $R_1$ is isopropyl and $R_2$ is n-propyl. In some implementations, $R_1$ is ethyl and $R_2$ is 2-methylpropyl.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A lithography method comprising:
   forming a resist layer over a workpiece;
   exposing the resist layer to radiation; and
   exposing the resist layer to a developer that removes an unexposed portion of the resist layer, thereby forming a patterned resist layer, wherein the developer includes an organic solvent having a log P value greater than 1.82, and further wherein the organic solvent is represented by a formula:

wherein at least one of $R_1$ and $R_2$ are a propyl functional group.

2. The lithography method of claim 1, wherein $R_1$ is n-propyl and $R_2$ is isopropyl.

3. The lithography method of claim 1, wherein $R_1$ is isopropyl and $R_2$ is n-propyl.

4. The lithography method of claim 1, wherein $R_1$ is ethyl and $R_2$ is 2-methylpropyl.

5. The lithography method of claim 1, wherein the resist layer includes a negative tone resist material, wherein a solubility of the negative tone resist material decreases when exposed to the radiation.

6. The lithography method of claim 1, wherein the exposing the resist layer to radiation includes exposing the resist layer to an extreme ultraviolet (EUV) radiation.

7. The lithography method of claim 1, wherein the exposing the resist layer to radiation includes exposing the resist layer to an electron beam (e-beam).

8. The lithography method of claim 1, wherein the resist layer includes hydroxybenzyl.

9. A lithography method comprising:
   forming a negative tone resist layer over a workpiece;
   exposing the negative tone resist layer to extreme ultraviolet (EUV) radiation; and
   removing an unexposed portion of the negative tone resist layer in a negative tone developer, thereby forming a patterned negative tone resist layer, wherein the negative tone developer includes an organic solvent having a log P value greater than 1.82, and further wherein the organic solvent is an ester acetate derivative represented by $R_1COOR_2$, where $R_1$ and $R_2$ are hydrocarbon chains having four or less carbon atoms.

10. The lithography method of claim 9, wherein $R_1$ is n-propyl and $R_2$ is isopropyl.

11. The lithography method of claim 9, wherein $R_1$ is isopropyl and $R_2$ is n-propyl.

12. The lithography method of claim 9, wherein $R_1$ is ethyl and $R_2$ is 2-methylpropyl.

13. The method of claim 9, further comprising performing a baking process on the negative tone resist layer after the exposing.

14. The method of claim 9, further comprising processing the workpiece using the patterned negative tone resist layer as a mask.

15. The method of claim 9, wherein the negative tone resist layer includes less than about 40% poly(p-hydroxystyrene) (PHS).

16. The method of claim 9, wherein the negative tone developer further includes n-butyl acetate (n-BA).

17. A lithography method comprising:
   spin coating a resist material over a workpiece;
   performing a pre-exposure baking process on the resist material;
   illuminating the resist material with patterned extreme ultraviolet (EUV) radiation, thereby forming an exposed portion and an unexposed portion of the resist material;
   performing a post-exposure baking process on the resist material; and
   applying a developer to the resist material that dissolves the unexposed portion of the resist material, wherein the developer includes an organic solvent having a log P value greater than 1.82, and further wherein the organic solvent is an ester acetate derivative represented by $R_1COOR_2$, where $R_1$ and $R_2$ are hydrocarbon chains having four or less carbon atoms.

18. The lithography method of claim 17, further comprising performing a post-development baking process on the resist material.

19. The lithography method of claim 17, further comprising performing a rinsing process after applying the developer to the resist material.

20. The lithography method of claim 17, wherein the resist material is a chemically-amplified resist material.

* * * * *